(12) United States Patent
Nakamura

(10) Patent No.: US 6,415,411 B1
(45) Date of Patent: Jul. 2, 2002

(54) ERROR CORRECTING DECODER

(75) Inventor: Masaru Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/466,922

(22) Filed: Dec. 20, 1999

(30) Foreign Application Priority Data

Dec. 28, 1998 (JP) .......................................... 10-374495

(51) Int. Cl.[7] .............................................. H03M 13/29
(52) U.S. Cl. ........................ 714/755; 714/765; 714/769
(58) Field of Search ................................ 714/755, 765, 714/769

(56) References Cited

U.S. PATENT DOCUMENTS

| | | | | |
|---|---|---|---|---|
| 4,541,092 A | * | 9/1985 | Sako et al. | 714/756 |
| 4,653,051 A | * | 3/1987 | Sugimura et al. | 714/755 |
| 4,653,052 A | * | 3/1987 | Doi et al. | 714/755 |
| 4,719,628 A | * | 1/1988 | Ozaki et al. | 714/755 |
| 4,845,714 A | * | 7/1989 | Zook | 714/755 |
| 4,972,416 A | * | 11/1990 | Nagai et al. | 714/755 |
| 5,247,523 A | * | 9/1993 | Arai et al. | 714/748 |
| 5,299,208 A | * | 3/1994 | Blaum et al. | 714/761 |
| 5,311,522 A | * | 5/1994 | Murakami | 360/53 |
| 5,408,477 A | * | 4/1995 | Okada et al. | 714/755 |
| 5,684,810 A | * | 11/1997 | Nakamura et al. | 714/755 |

FOREIGN PATENT DOCUMENTS

| | | |
|---|---|---|
| EP | 0825603 | 2/1998 |
| JP | 10-55630 | 2/1989 |
| JP | 6-244741 | 9/1994 |
| JP | 6-268530 | 9/1994 |
| JP | 7-202719 | 8/1995 |

* cited by examiner

*Primary Examiner*—Stephen M. Baker
(74) *Attorney, Agent, or Firm*—McGinn & Gibb, PLLC

(57) ABSTRACT

The error correcting decoder using an erasure flag process for a digital signal, according to the present invention, comprises: a row code word corrector for correcting errors in each row; a column code word corrector for correcting errors in each column; a first counter for counting the respective numbers of the uncorrectable rows and of the error corrected rows; a second counter for counting the number of error corrected symbols in each column; a storage device for storing the states of the corrected symbols; and an erasure flag selector for appropriately setting erasure flags for each column, based on the count results and the stored data.

15 Claims, 8 Drawing Sheets

ERROR CORRECTING DECODER

BACKGROUND OF THE INVENTION

1. Field of the Invention

The present invention relates to an error correcting decoder using an erasure flag method to correct a bit error arising in transmission or playback of a digital signal.

This application is based on Japanese Patent Application No. 10-374495, the contents of which are incorporated herein by reference.

2. Description of the Related Art

Conventional recording/playback systems for a digital signal of a VTR, an optical disc, or the like, utilize a product code shown in FIG. 11. In this product code, the row direction is defined as C1 (n1, k1), the column direction is defined as C2 (n2, k2), and the rows and the columns are encoded separately. This method is a double decoding in which errors are corrected when decoding the rows, and then the remaining errors are corrected when decoding the columns. Reference characters n1 and n2 indicate code word lengths, and k1 and k2 indicate data code word lengths.

The errors arising when reading the digital signal of the VTR or the optical disc are random errors which occur at random, and burst errors which are continuous due to a damage or dust on a medium. In VTR or optical disc systems, when the burst errors beyond the correction capability arise, the errors are uncorrectable by C1 correction. Subsequently, by the C2 correction, the symbols which were not corrected by the C1 correction are. corrected. Thus, the double encoded product code provides strong and efficient correction. Here, the symbol is a unit of the code word length or of the data code word length.

The C1 correction and the C2 correction will be explained. When the minimum distances between code words are defined as d1 for the C1 correction, and d2 for the C2 correction, the C1 correction can correct at most (d1−1)/2 symbols. Further, the C2 correction can correct at most (d2−1)/2 symbols. When in C2 correction erasure information is provided by erasure flags, at most (d2−1) symbols can be corrected.

The erasure flag indicates the uncorrectable rows in the C1 correction, or the uncorrectable rows and the rows with more than N corrected symbols (N is an integer equal to or above 1) in the C1 correction, as doubtful rows which may include errors. This information is used in the C2 correction.

When d1=11, the C1 correction can correct at most five errors, and the erasure flags are set for the uncorrectable rows which includes six or more errors. Alternatively, because the 5-error correction reaches the limit of the correction capability and the mis-correction rate is high, the erasure flags are set for the uncorrectable rows and the 5-error corrected rows. Thus, by using the erasure flags indicating the location information of the doubtful rows, at most (d2−1) symbols can be corrected by the C2 correction.

This conventional technique is described in the "Background Art" of Japanese Patent Application, First Publication No. Hei 7-202719, "Error Correction Code Decoder."

While the methods for setting the erasure flags differ depending on systems, the erasure flags are set after the C1 correction period, and are fixed throughout the C2 correction.

In the C2 correction, the following corrections are possible according to the combination of the error symbols without the erasure flags and the number of the erasure flags. When d2=9, 4-error correction only for symbol correction, 8-erasure correction only by the erasure flags, and their combinations, which are 1-error/6-erasure correction, 2-error/4-erasure correction, and 3-error/2-erasure correction, are possible.

Regarding the existence of an error for which the erasure flag is not set in the C2 correction, because the erasure flags are set for the uncorrectable rows, the error-corrected rows include no error if there is no mis-correction. However, mis-corrections stochastically arise, and therefore error correction is necessary even in the C2 correction. The product code by the combination of the C1 correction and the C2 correction can thus provide strong and efficient correction.

The conventional error correcting decoder will be explained with reference to FIG. 5.

The decoder comprises: a C1 correction circuit 1 for performing the C1 correction; an error corrected row counter 2 for counting the numbers of the uncorrectable rows and of the N-error corrected rows in the C1 correction; a row correction state storage circuit 3 for storing the correction states of the rows corrected by the C1 correction; an erasure flag selector 6 for selecting the erasure flags based on the output from the error corrected row counter 2 and row correction state storage circuit 3; and a C2 correction circuit 7 for performing the C2 correction.

As shown in FIG. 7, the error corrected row counter 2 comprises an uncorrectable row detection circuit 10, a (d1−1)/2 error corrected row detection circuit 11, a ((d1−1)/2−1) error corrected row detection circuit 12, ..., and a 1-error corrected row detection circuit 13, and counters 14 which are in one-to-one correspondence to the detection circuits 10 to 13. The detection circuits 10 to 13 detects the corrected rows, and the counters 14 count total numbers of errors in the C1 correction.

Specifically, when d1=11, the numbers of the uncorrectable rows, 5-error corrected rows, 4-error corrected rows, 3-error corrected rows, 2-error corrected rows, and 1-error corrected rows are counted in the C1 correction period.

FIG. 8 shows the structure of the row correction state storage circuit 3. The row correction state storage circuit 3 comprises: bit conversion circuits 15 in one-to-one correspondence to the detection circuits 10 to 13; and a memory 16 for storing the results of the correction for each row whenever the row is corrected by the C1 correction. The results of the correction are required to determine which error corrected rows the erasure flags for the C2 correction are to be set for. The memory 16 may be, e.g., an FIFO. The memory 16 may store bits indicating the results of the correction.

Specifically, when d1=11, three bits are required. The memory 16 stores, e.g., "111" for uncorrectable errors, "101" for 5-error correction, "100" for 4-error correction, "011" for 3-error correction, "010" for 2-error correction, "001" for 1-error correction, and "000" for no error correction.

After the C1 correction, the erasure flag selector 6 selects the erasure flag so as to make the C2 correction for each column efficient.

The algorithm of the erasure flag selector 6 is shown in FIG. 6. Since the error corrected row inevitably includes mis-correction, it is determined in step S11 in FIG. 6 whether the total number of uncorrectable rows, (d1−1)/2-error corrected rows, ..., 1-error corrected rows is equal to or below d2−1. These values are stored in the error corrected row counter 2 shown in FIG. 5, and the total number can be calculated from the values.

When the total number is equal to or below d2−1, the same number of the erasure flags as the total number is to be set according to "erasure flags=the total number" (step S16). In the C2 correction, based on the state of the error correction for each row stored in the row correction state storage circuit 3, the symbols are read in the column direction, and simultaneously the erasure flags are set for the symbols with which the information indicating one or more error corrected rows is read from the row correction state storage circuit 3, and then the C2 correction is carried out. When in step S11 the total number exceeds d2−1, the flow proceeds to the next step S13.

In step S13, it is determined whether the total number of uncorrectable rows, (d1−1)/2-error corrected rows, . . . , and 2-error corrected rows is equal to or below d2−1. Subsequently, the total number in the selection of the error corrected rows is decremented, to thus obtain the condition when the total number is equal to or below d2−1. When the total number of the uncorrectable rows and (d1−1)/2-error corrected rows in step S15 is equal to or below d2−1, the erasure flags are set for these rows. When the total number is above d2−1, the erasure flags are set only for the uncorrectable rows. Then, the C2 correction is carried out.

This example, which is widely used, is simplified, and is effective, is a method for setting the erasure flags only for the uncorrectable rows. The circuit structure, which is shown in FIGS. 5, 7, and 8, may be comprised only of the circuits for handling the uncorrectable rows. The algorithm shown in FIG. 6 includes only step S15, and is therefore considerably simplified. Further, because the bit conversion circuit 15 in FIG. 8 can indicate by only one bit whether the row is correctable or not, the required capacity of the memory 16 may be reduced.

However, because the conventional error correcting decoder performs the C2 correction while fixing the erasure flags after the C1 correction, there is a problem that the erasure flags may not be appropriate for each column.

BRIEF SUMMARY OF THE INVENTION

It is therefore an object of the present invention to provide an error correcting decoder with improved correction capability which can correct a column, which is not corrected by the background art, by selecting a process for setting the erasure flags for each column in the C2 correction.

In order to accomplish the above object, the error correcting decoder using an erasure flag process for a digital signal, according to the present invention, comprises: a row code word corrector for correcting errors in each row; a column code word corrector for correcting errors in each column; a first counter for counting the respective numbers of the uncorrectable rows and of the error corrected rows; a second counter for counting the number of error corrected symbols in each column; a storage device for storing the states of the corrected symbols; and an erasure flag selector for appropriately setting erasure flags for each column, based on the count results and the stored data.

In another aspect of the present invention, when the first total number of uncorrectable rows+(d1−1)/2-error corrected rows+ . . . +(N+1)–error corrected rows+N-error corrected rows (d1: the minimum distance between code words in the row correction, N: an integer equal to or below (d1−1)/2) is equal to or below d2−1 (d2: the minimum distance between code words in the column correction), the erasure flag selector sets the erasure flags for the corresponding symbols. When the total number exceeds d2−1 in the previous step and the total number of uncorrectable rows+ (d1−1)/2-error corrected rows+ . . . +N+1-error corrected rows+N-error corrected symbols is equal to or below d2−1, the erasure flag selector sets the erasure flags for the corresponding symbols. Then, N is decremented by one when the total number exceeds d2−1 in the previous step, and the first to third steps are repeated. When the total number of uncorrectable rows and (d1−1)/2-error correction symbols exceeds d2−1, the erasure flag selector sets the erasure flags for the uncorrectable rows.

In another aspect of the invention, the erasure flag selector changes the erasure flags for each column in the column correction.

In another aspect of the invention, the first counter counts the respective numbers of the uncorrectable rows and of the (d1−1)/2-error corrected rows, and the second counter for counting the number of (d1−1)/2-error corrected symbols (d1: the minimum distance between code words in the row correction).

In another aspect of the invention, when the total number of uncorrectable rows and (d1−1)/2-error corrected rows is equal to or below d2−1 (d2: the minimum distance between code words in the column correction), the erasure flag selector sets the erasure flags for the corresponding symbols. When in the previous step the total number exceeds d2−1 and the total number of uncorrectable rows and the (d1−1)/ 2-error corrected symbols is equal to or below d2−1, the erasure flag selector sets the erasure flags for the corresponding symbols. When in the previous step the total number exceeds d2−1, the erasure flag selector sets the erasure flags for the uncorrectable rows According to the present invention, when two or more mis-corrected symbols are not in the same column in the C2 correction, the five symbols out of eleven symbol errors can be corrected. As the number of errors increases, the present invention becomes more effective. For example, although errors in an image signal are inconspicuous because of interpolation, as the number of errors increases, the errors can be visually found. While errors in an audio signal are inconspicuous because of the interpolation, the sound may be unnatural as the number of errors increases. Therefore, the error should not be transmitted to the following system.

The present invention can correct uncorrectable symbols derived from mis-correction, improve the correction capability by the erasure flag control for each column. Further, the invention reduces the transmission of the errors, preventing deterioration of image or audio data.

DETAILED DESCRIPTION OF THE INVENTION

Figure 1:
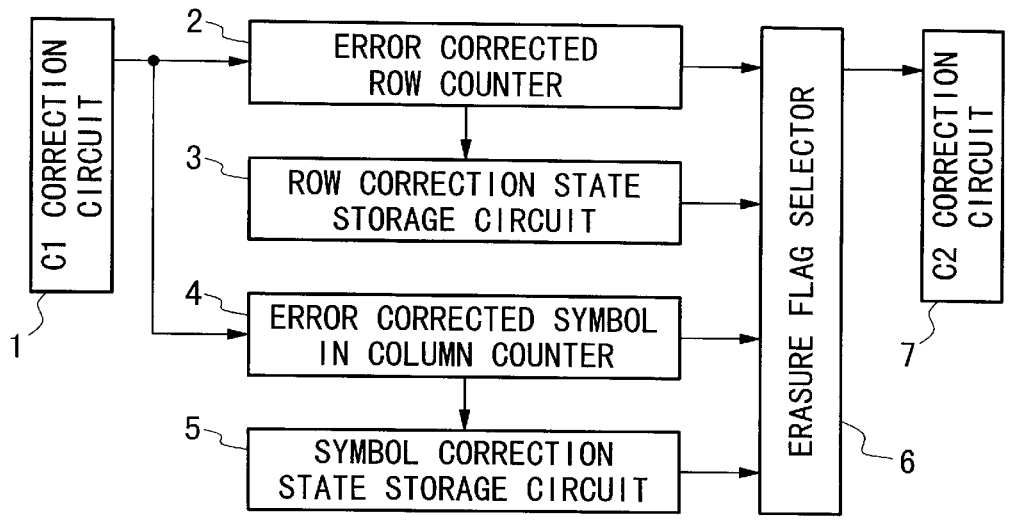
FIG. 1 is a block diagram showing the first embodiment of the error correcting decoder of the present invention.

With the minimum distance d1 between codes in C1 correction and with the minimum distance d2 between codes in C2 correction, a product code is produced. For instance, when d2=9, 4-error/0-erasure correction, 3-error/2-erasure correction, 2-error/4-erasure correction, 1-error/6-erasure correction, and 0-error/8-erasure correction are possible.

When d1=11, at most five errors can be corrected by the C1 correction. However, because the 5-error correction reaches the limit of correction, the mis-correction rate of the 5-error correction is higher than that of the 4-error correction. Similarly, the mis-correction rate of the 4-error correction is higher than that of the 3-error correction. That is, as the number of corrected errors increases, the mis-correction rate increases.

An erasure flag may be set only for uncorrectable rows, for uncorrectable rows and 5-error corrected rows, or for uncorrectable rows, 5-error corrected rows, and 4-error corrected rows. In any case, when d2=9, because 8 erasures are the maximum, more than eight erasure flags are prohibited.

For instance, when there are four uncorrectable rows, three 5-error corrected rows, and two 4-error corrected rows, erasure flags can be set for the four uncorrectable rows, or for seven rows in total of the four uncorrectable rows and the three 5-error corrected rows.

When there are ten rows which are seven uncorrectable rows and three 5-error corrected rows, erasure flags are set for the seven uncorrectable rows in conventional method. However, because the 5-error correction reaches the limit of correction, the mis-correction rate is high. When there is mis-correction in one of three 5-error corrected rows, the row with the corrected symbols or the error symbols contains one error and seven erasures, which are uncorrectable. The remaining error may be transmitted to the following system, causing the image or audio signal to deteriorate, and therefore interpolation is necessary.

Even when there is mis-correction in one of the 5-error corrected rows, correction is possible by specifying the mis-correction or the mis-corrected symbol and the error symbol and setting an erasure flag for them, which can be then corrected by 0-error/8-erasure correction by the C2 correction. However, there is no way to know the mis-correction.

To reduce the number of errors transmitted to the following system, erasure flags are set for the corrected symbols. in the 5-error corrected row. Here, the 5-error mis-correction means that, although there are six errors which are actually uncorrectable because d1=11, the five errors are corrected so that the code words which are distant by 11 from the other code words are corrected. Therefore, there are 11 errors from the other code word. That is, the row includes five corrected symbols and six error symbols. By setting the erasure flags for the five corrected symbols, 0-error/8-erasure correction is possible in the C2 correction (column A in FIG. 12). However, the remaining six errors cannot be corrected, and error flags are transmitted to the following system, which is to perform interpolation.

Figure 12:
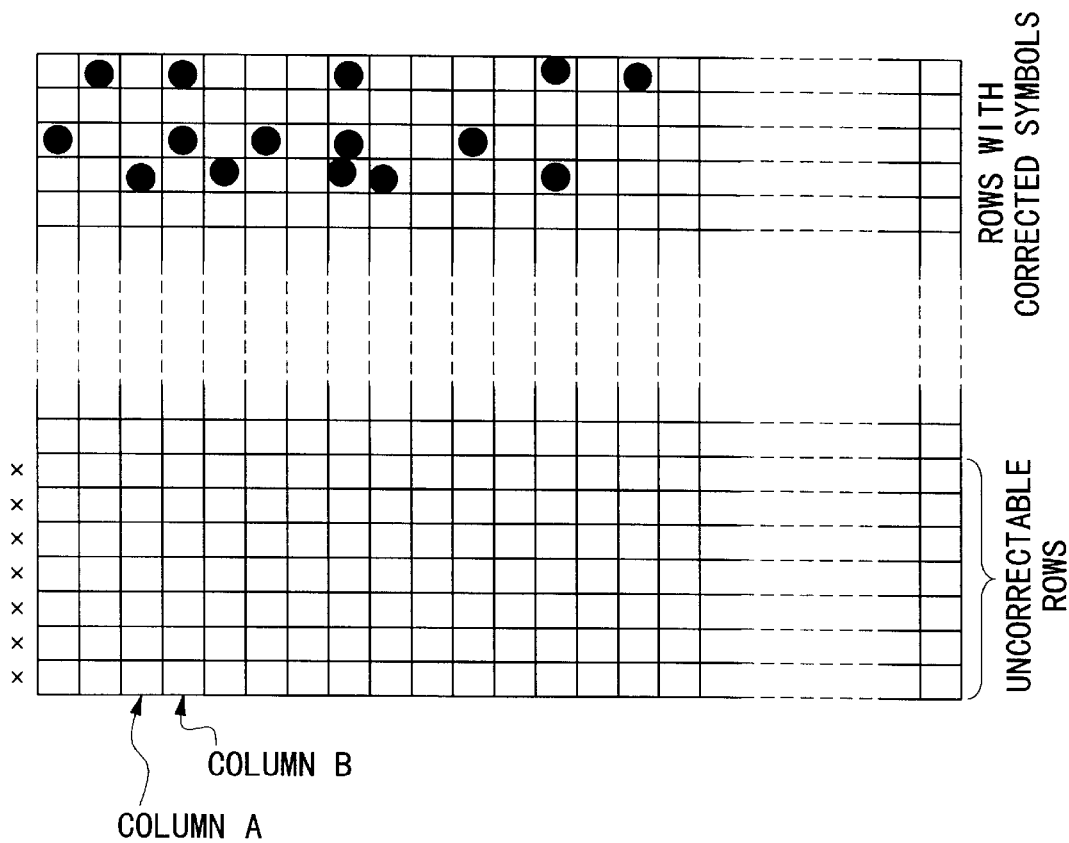
FIG. 12 is a diagram showing an example of setting of erasure flags in C2 correction.

In FIG. 12, because there are three rows each of which includes five symbol errors, two or more mis-corrected symbols must not be in the same column in the C2 correction. If there are two or more mis-corrected symbols, the correction is impossible because of 0-error/9-erasure (column B in FIG. 12). That is, when two or more mis-corrected symbols are not in the same column in the C2 correction, the five symbols out of eleven symbol errors can be corrected.

The first embodiment of the present invention will be explained with reference to FIG. 1. The embodiment is assumed to be a system wherein d1=11, and d2=9 in a manner similar to the above example.

Referring to FIG. 1, the embodiment comprises a C1 correction circuit 1, an error corrected row counter 2, a row correction state storage circuit 3, an error-corrected-symbol-in-column counter 4, a symbol correction state storage circuit 5, an erasure flag selection circuit 6, and a C2 correction circuit 7.

For a digital signal of, e.g., a VTR or an optical disc, the C1 correction circuit 1 performs correction for each row, and the C2 correction circuit 7 performs correction for each column.

The error corrected row counter 2 counts the respective numbers of uncorrectable rows and of N-error corrected rows (N is a positive integer equal to or above 1 and below (d1−1)/2). The row correction state storage circuit 3 stores the states of the corrected rows in the entire C1 correction.

Figure 7:
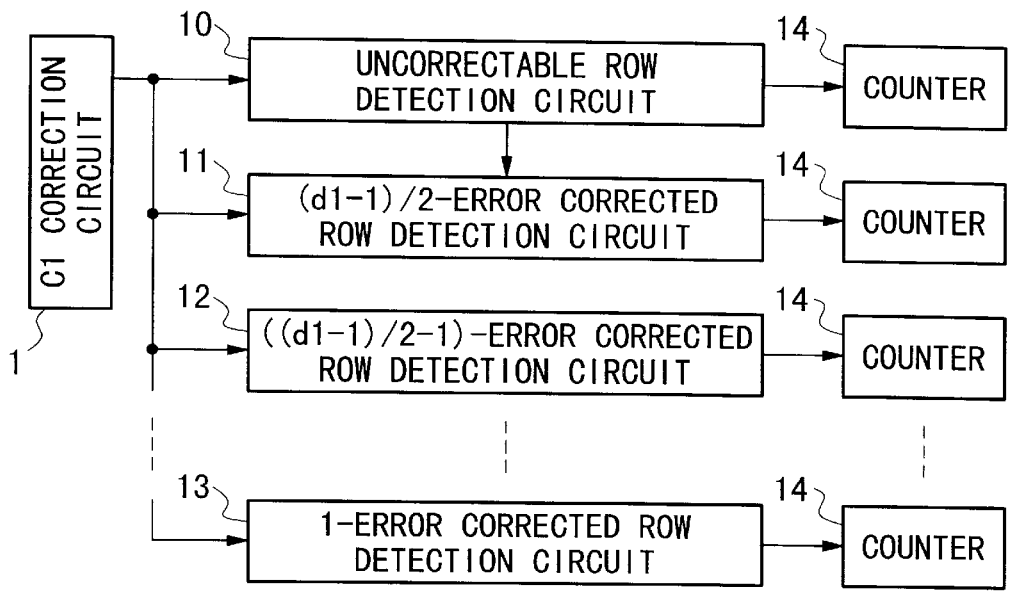
FIG. 7 is a diagram showing the structure of an error corrected row counter.

As shown in FIG. 7, the error corrected row counter 2 comprises an uncorrectable row detection circuit 10, a (d1−1)/2 error corrected row detection circuit 11, a ((d1−1)/2−1) error corrected row detection circuit 12, . . . , and a 1-error corrected row detection circuit 13, which detect the states of the corrected rows, and counters 14 which are in one-to-one correspondence to the detection circuits 10 to 13 and count the respective total numbers of errors detected by the detection circuits 10 to 13.

In the above example, the counter 14 counts the respective numbers of uncorrectable rows, 5-error corrected rows, 4-error corrected rows, 3-error corrected rows, 2-error corrected rows, and 1-error corrected rows in the C1 correction period.

Figure 8:
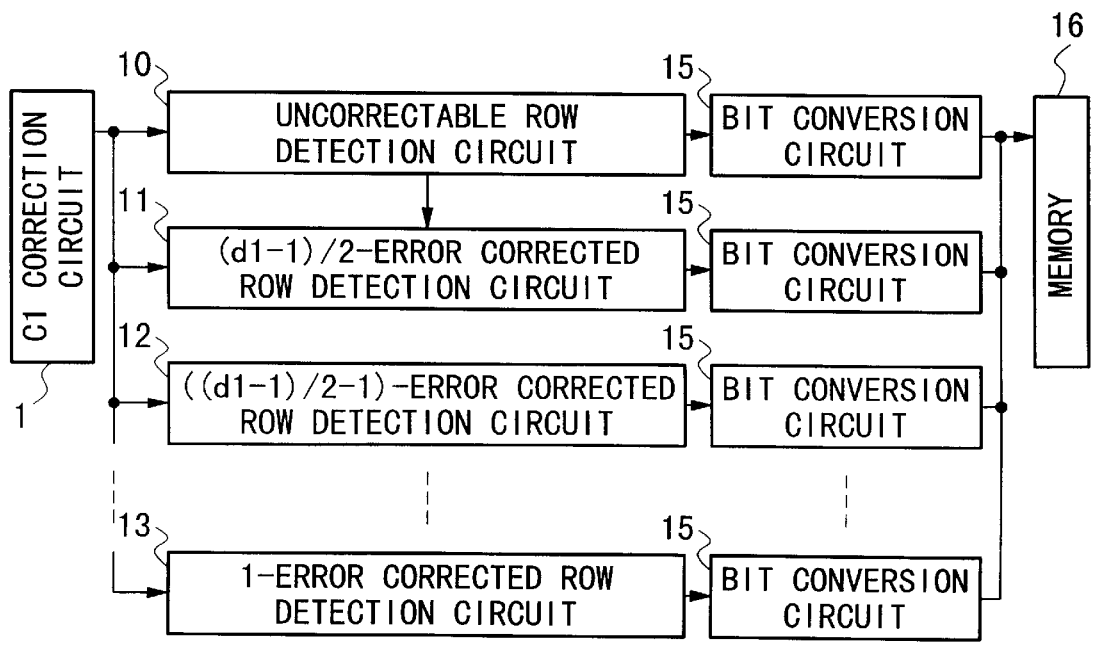
FIG. 8 is a diagram showing the structure of a row correction state storage circuit.

Referring to FIG. 8, to determine which error corrected rows the erasure flags for the C2 correction are to be set for, the row correction state storage circuit 3 includes a memory 16 such as an FIFO, and bit conversion circuits 10 to 13 in one-to-one correspondence to the detection circuits 10 to 13. The memory 16 stores the results of the correction for each row whenever the row is corrected by the C1 correction. The bit conversion circuits 15 convert the results of the correction into bits, and write the bits in the memory 16.

Specifically, three bits are required in this embodiment. The memory stores different bits depending on the number of errors, e.g., "111" for uncorrectable errors, "101" for 5-error correction, "100" for 4-error correction, "011" for 3-error correction, "010" for 2-error correction, "001" for 1-error correction, and "000" for no error correction.

The error-corrected-symbol-in-column counter 4 counts the number of error corrected symbols in each column in the entire C1 correction. The symbol correction state storage circuit 5 stores the correction states of the symbols.

Figure 9:
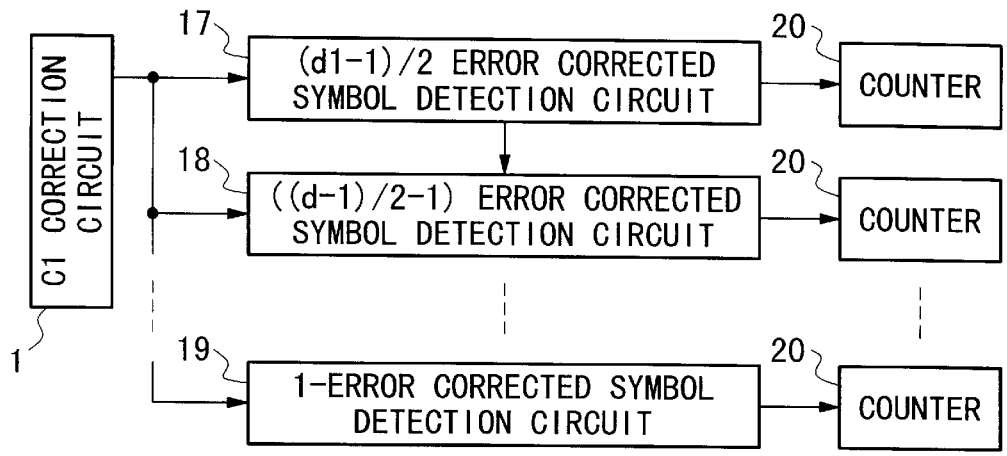
FIG. 9 is a diagram showing the structure of an error-corrected-symbol-in-column counter.

As shown in FIG. 9, the number-of-error-corrected-symbol-in-column 4 comprises a (d1−1)/2 error corrected symbol detection circuit 17, a ((d1−1)/2−1) error corrected symbol detection circuit 18, . . . , and a 1-error corrected symbol detection circuit 19, and counters 20 which detect correction states of the corrected symbols in each column. The number-of-error-corrected-symbol-in-column 4 counts the total numbers of symbols corrected by the C1 correction period.

Specifically, the respective numbers of 5-error corrected symbols (the symbols corrected by the 5-error correction, the same shall apply thereinafter), 4-error corrected symbols, 3-error corrected symbols, 2-error corrected symbols, and 1-error corrected symbol, in each column, are counted.

Figure 10:
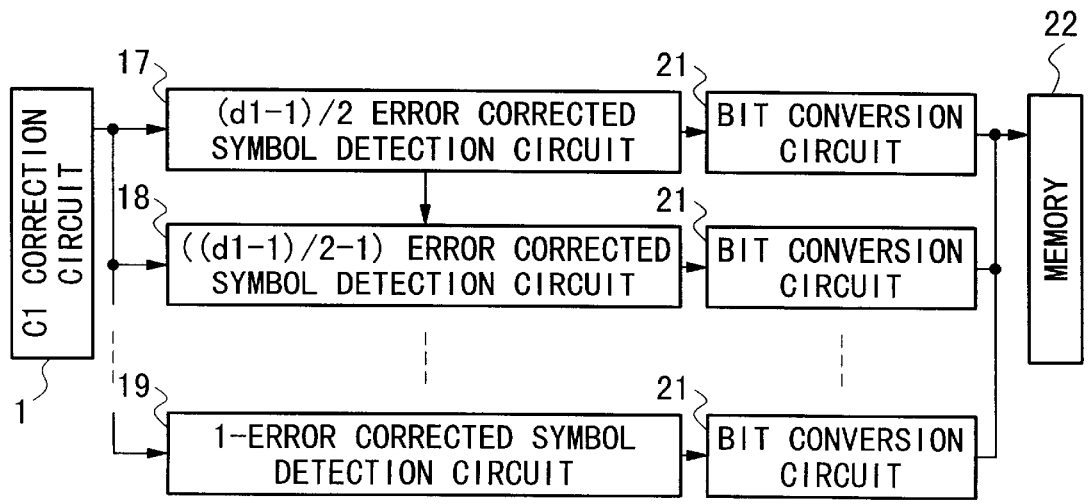
FIG. 10 is a diagram showing the structure of a symbol correction state storage circuit.
Figure 11:
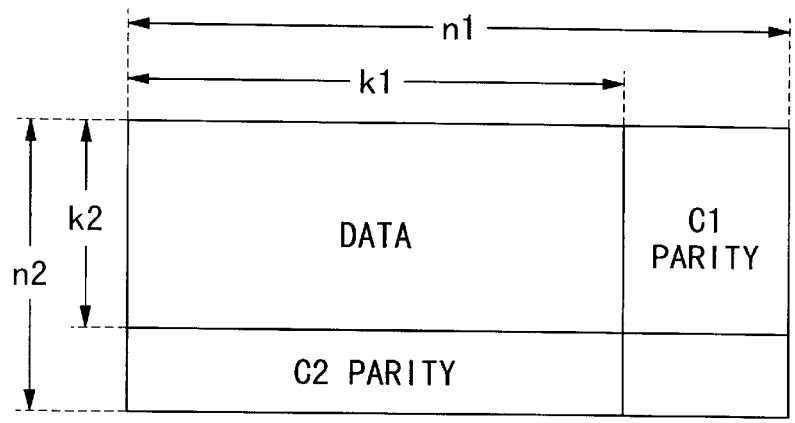
FIG. 11 is a diagram showing general product codes.

Referring to FIG. 10, to obtain information of which error correction was performed for each symbol, the symbol correction state storage circuit 5 includes a memory 22 such as an SRAM, and bit conversion circuits 21 in one-to-one correspondence to the error-corrected symbol detection circuits 17 to 19. The memory 22 has addresses corresponding to the symbols and stores the states of the corrected symbols whenever the symbols are corrected. The bit conversion circuits 21 convert the results of the error correction into bits, and write the bits in the memory 22.

Specifically, three bits are required in this embodiment. The memory 22 stores different bits depending on the number of errors, e.g., "101" for 5-error correction, "100" for 4-error correction, "011" for 3-error correction, "010" for 2-error correction, and "001" for 1-error correction. When the memory has a data width of symbol bit width+three bits, addition of a memory is not necessary.

Then, after the completion of the C1 correction, the erasure flag elector 6 selects erasure flags so as to make the C2 correction most efficient or each column.

Figure 3:
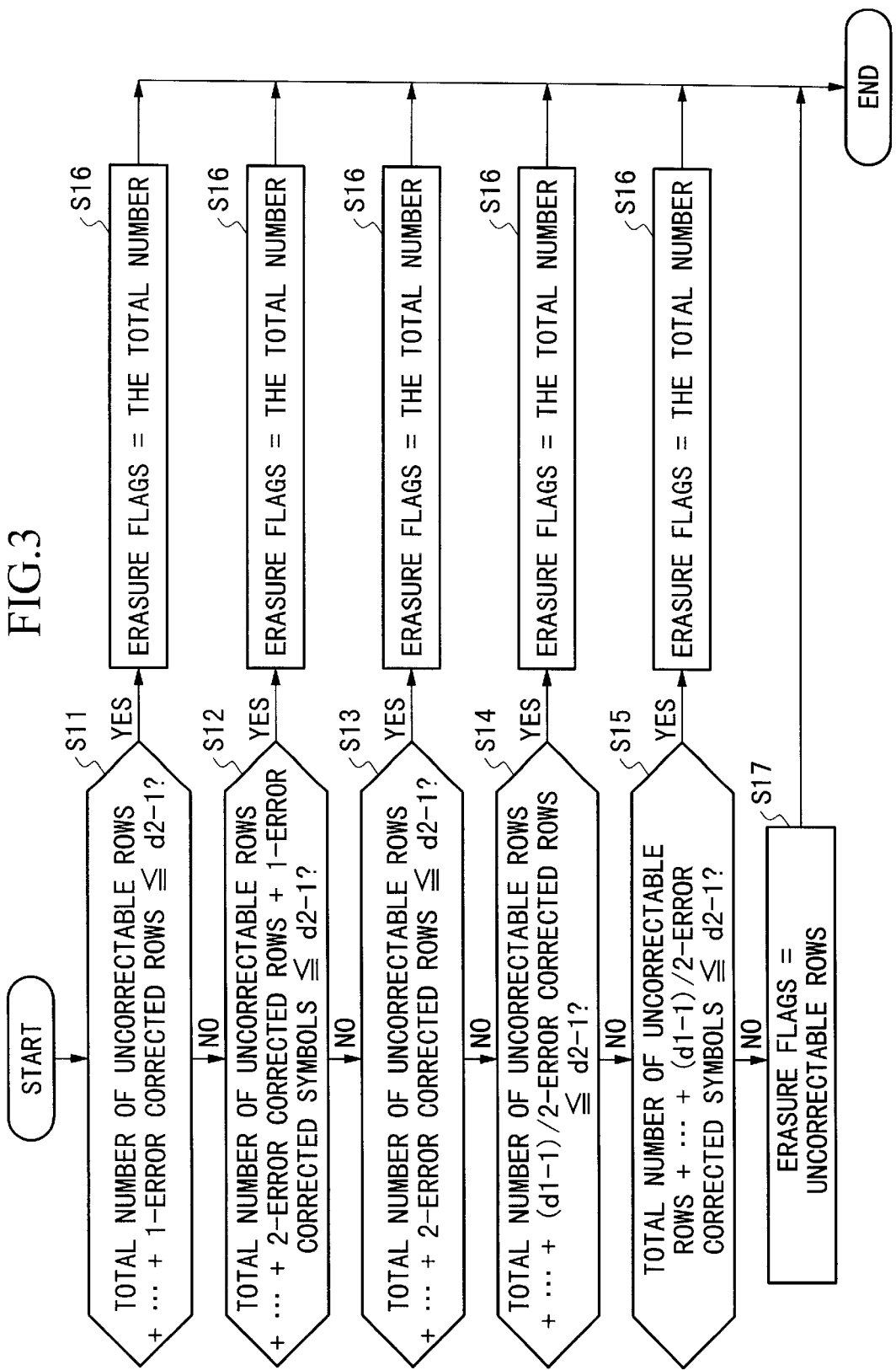
FIG. 3 is a flowchart showing the operation of an erasure flag selector of the first embodiment.

The algorithm of the erasure flag selector 6 is shown in FIG. 3. Since the error-corrected row inevitably includes mis-correction, it is determined in step S11 whether the total number of uncorrectable rows+(d1−1)/2-error corrected rows+ . . . +2-error corrected rows+1-error corrected rows is equal to or below d2−1. These values are stored in the error corrected row counter 2 shown in FIG. 1, and the total number can be calculated from the values. When the total number is equal to or below d2−1, the same number of the erasure flags as the total number are to be set according to "erasure flags the total number" (step S16).

In the C2 correction, based on the states of the corrected errors for each row stored in the row correction state storage circuit 3, the symbols are read in the column direction, and simultaneously the erasure flag is set for the symbol with which the information indicating one or more error corrected rows is read from the row correction state storage circuit 3. When in step S11 the total number exceeds d2−1, the flow proceeds to the next step S12.

Figure 6:
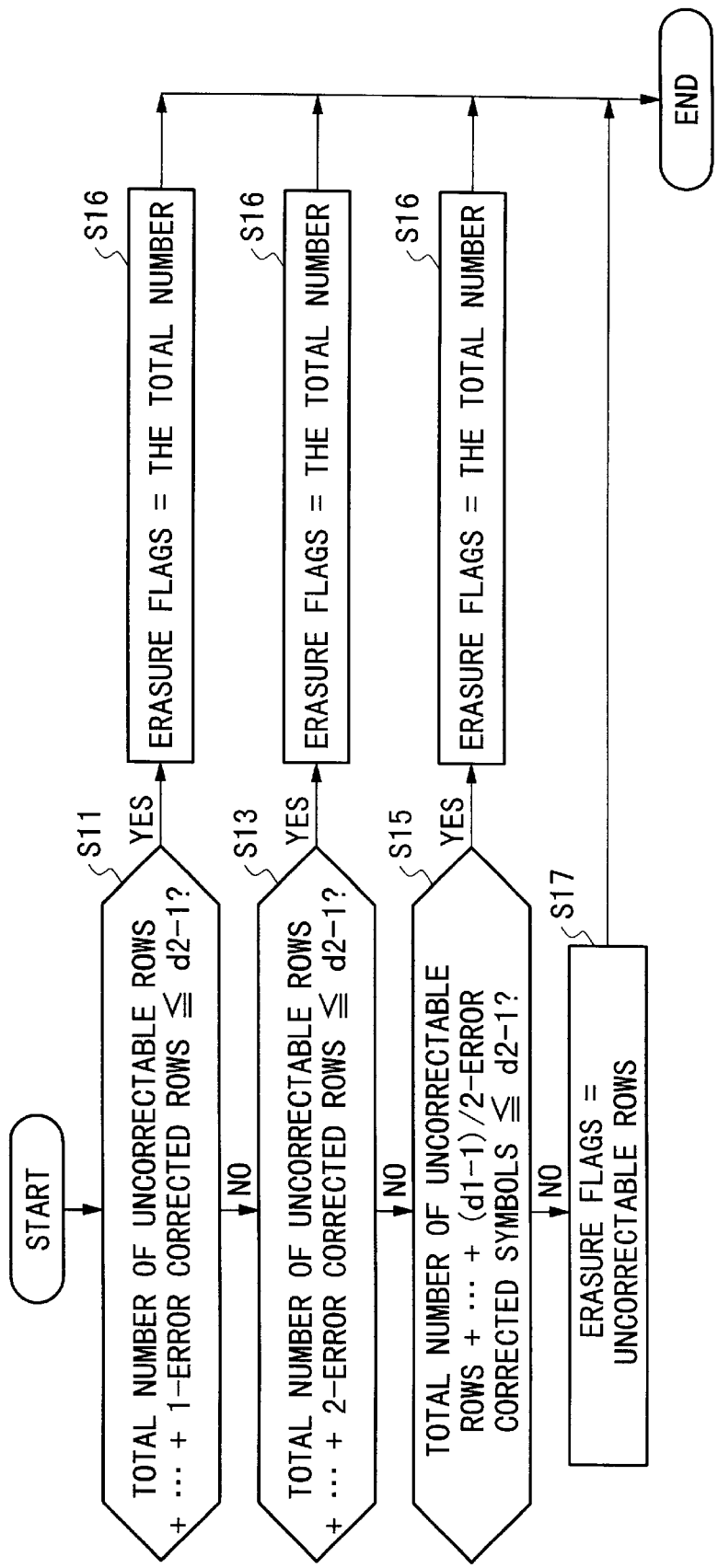
FIG. 6 is a flowchart showing the operation of an erasure flag selector of the conventional error correcting decoder.

It is determined in step S12 whether the total number of uncorrectable rows+(d1−1)/2-error corrected rows+ . . . +2-error corrected rows+1-error corrected symbols is equal to or below d2−1. While in FIG. 6 the total number is calculated from the uncorrectable rows to the 2-error corrected rows, the number of 1-error symbols is also added in this step. The value of the number of the 1-error corrected symbols is stored in the corrected-symbol-in-column counter 4 shown in FIG. 1, and can be obtained therefrom. That is, it is determined whether the total number of the uncorrectable rows to the 2-error corrected rows and the 1-error corrected symbols is equal to or below d2−1. When it is equal to or below d2−1, the number of the erasure flags is set to be the same as this total number.

In the C2 correction, since the row correction state storage circuit 3 stores the states of the error corrected rows and the symbol correction state storage circuit 5 stores information of the 1-error corrected symbols, the symbols are read in the column direction, and simultaneously the erasure flags are set for the symbols, with which the information indicating two or more error corrected rows or 1-error corrected symbols is read, from the storage circuits 3 and 5.

When in step S12 the total number exceeds d2−1, the flow proceeds to step S13. Since in the above C2 correction 1-error corrected symbol information is added, the erasure flags are set for two or more error correction, and, if there is the 1-error corrected symbol in the column, the erasure flags are additionally set.

In step S13, it is determined whether the total number of uncorrectable rows+(d1−1)/2-error corrected rows+ . . . +2-error corrected rows is equal to or below d2−1. Similarly, it is alternately determined whether the total number of uncorrectable rows+(d1−1)/2-error corrected rows+ . . . N+1-error corrected rows+N-error corrected rows equal to or below d2−1, and whether the total number of uncorrectable rows+(d1−1)/2-error corrected rows+ . . . N+1-error corrected rows+N-error correction symbols is equal to or below d2−1. When in step S15 the total number of uncorrectable rows+(d1−1)/2-error corrected symbols is equal to or below d2−1, the same number of the erasure flags as the total number is to be set. When the total number is above d2−1, the erasure flags are set for the uncorrectable rows, and then the C2 correction is performed.

Although in the background art the selection of the erasure flags is performed only once after the C1 correction, this invention performs the selection in each column for the C2 correction. The erasure flags are appropriately set so that the error correction becomes the most effective, thereby reducing the uncorrectable error rate.

The second embodiment of the present invention will be explained with reference to FIG. 2.

The second embodiment eliminates the determinations for less than (d1−1)/2 errors which is included in the first embodiment.

Figure 2:
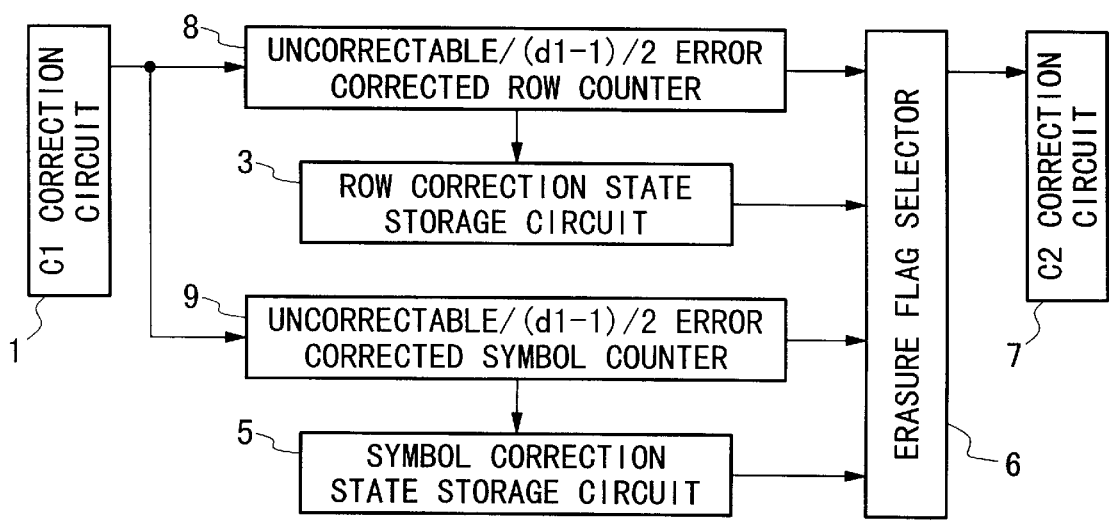
FIG. 2 is a block diagram showing the second embodiment of the error correcting decoder of the present invention.
Figure 4:
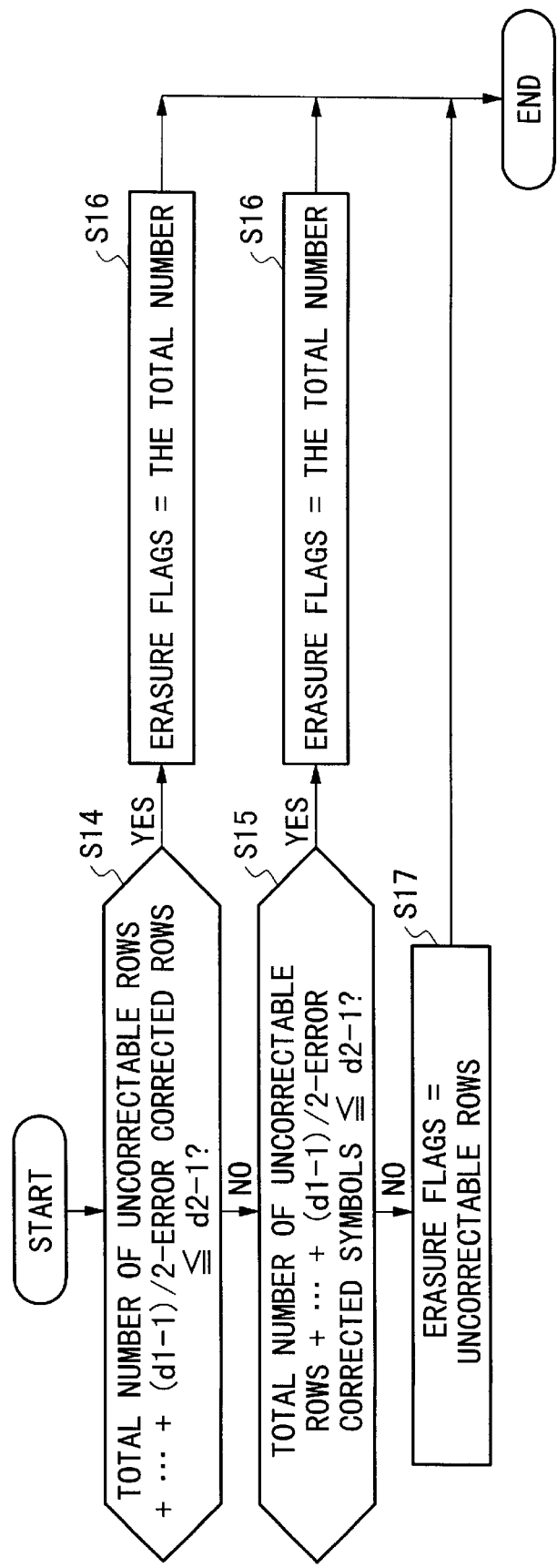
FIG. 4 is a flowchart showing the operation of an erasure flag elector of the second embodiment.
Figure 5:
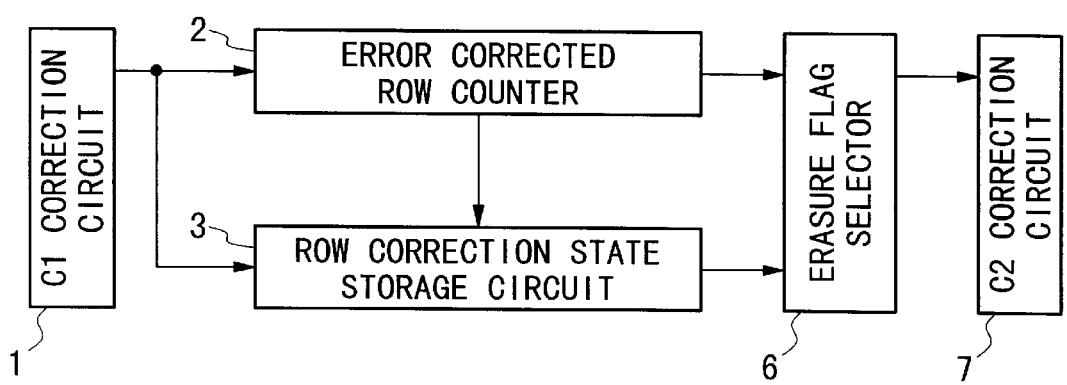
FIG. 5 is a block diagram showing the conventional error correcting decoder.

FIG. 2 is a block diagram showing the second embodiment, and FIG. 4 shows the algorithm of the erasure flag selector circuit in the second embodiment.

Referring to FIG. 2, the embodiment handles only the uncorrectable rows, the (d1−1)/2-error corrected symbols, and (d1−1)/2-error corrected rows, and eliminates the process for the others.

An uncorrectable/(d1−1)/2 error corrected row counter 8 is provided instead of the error corrected row counter 2. An uncorrectable/(d1−1)/2 error-corrected-symbol-in-column counter 9 is provided instead of the error-corrected-symbol-in-column counter 4.

In the flowchart of FIG. 4, it is determined whether the total number of uncorrectable rows+(d1−1)/2-error corrected rows is equal to or below d2−1 (step S14). When the total number is equal to below d2−1, the same number of the erasure flags as the total number are to be set (step S16). When the total number exceeds d2−1, it is determined whether the total number of uncorrectable rows+(d1−1)/2-error corrected symbols is equal to or below d2−1 (step S15). When the total number is equal to or below d2−1, the same number of the erasure flags as the total number is to be set. When the total number exceeds d2−1, the erasure flags are set for the uncorrectable rows (step S16). Based on the erasure flags, the C2 correction is performed. That is, the second embodiment narrows the conditions for setting the erasure flags which correspond to those in the later stage in the first embodiment.

The reason why the erasure flags are set for the (d1−1)/2-error corrected rows is that, because the maximum corrections are performed for these rows, the mis-correction rate is high. The second high mis-correction rate may be shown by the correction of the maximum correctable number −1.

The difference between their mis-correction rates, which depends on the minimum distance between codes and an error rate, reaches several squares of 10 times because the minimum distance between codes are lengthened in recent systems and the method for reducing the error rate is improved. Therefore, the determinations for performing corrections of minor errors significantly below the maximum correction performance may be eliminated in view of the mis-correction rate. Therefore, the second embodiment handles only three conditions, taking into consideration the above technical background.

While the second embodiment handles the uncorrectable rows and the rows corresponding to the maximum correction performance, the coverage may be freely set between the uncorrectable rows to the 1-error correction rows. Although this case requires more circuits than those in the second embodiment, the mis-correction rate is decreased.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. An error correcting decoder using an erasure flag process for a digital signal comprising:
    a row code word corrector for correcting errors in each row;
    a column code word corrector for correcting errors in each column;
    a first counter for counting the respective numbers of the uncorrectable rows and of the error corrected rows;
    a second counter for counting the number of error corrected symbols in each column;
    a storage device for storing the states of the corrected symbols; and
    an erasure flag selector for appropriately setting erasure flags for each column, based on the count results and the stored data.

2. An error correcting decoder according to claim 1, wherein, said erasure flag selector sets the erasure flags for the corresponding symbols when the first total number of uncorrectable rows+(d1−1)/2-error corrected rows+ . . . +(N+1)-error corrected rows+N-error corrected rows (d1: the minimum distance between code words in the row correction, N: an integer equal to or below (d1−1)/2) is equal to or below d2−1 (d2: the minimum distance between code words in the column correction),
    said erasure flag selector sets the erasure flags for the corresponding symbols when the total number exceeds d2−1 in the previous step and the total number of uncorrectable rows+(d1−1)/2-error corrected rows+ . . . +N+1-error corrected rows+N-error corrected symbols is equal to or below d2−1,
    N is decremented by one when the total number exceeds d2−1 in the previous step,
    the first to third steps are repeated; and
    the erasure flag selector sets the erasure flags for the uncorrectable rows when the total number of uncorrectable rows and (d1−1)/2-error correction symbols exceeds d2−1.

3. An error correcting decoder according to claim 1, wherein said erasure flag selector changes the erasure flags for each column in the column correction.

4. An error correcting decoder according to claim 1, wherein said first counter counts the respective numbers of the uncorrectable rows and of the (d1−1)/2-error corrected rows, and
    said second counter for counting the number of (d1−1)/2-error corrected symbols (d1: the minimum distance between code words in the row correction).

5. An error correcting decoder according to claim 4, wherein said erasure flag selector sets the erasure flags for the corresponding symbols when the total number of uncorrectable rows and (d1−1)/2-error corrected rows is equal to or below d2−1 (d2: the minimum distance between code words in the column correction),
    said erasure flag selector sets the erasure flags for the corresponding symbols when in the previous step the total number exceeds d2−1 and the total number of uncorrectable rows and the (d1−1)/2-error corrected symbols is equal to or below d2−1, and
    said erasure flag selector sets the erasure flags for the uncorrectable rows when in the previous step the total number exceeds d2−1.

6. An error correcting method using an erasure flag process for a digital signal comprising the steps of:
    correcting errors in each row;
    counting the respective numbers of the uncorrectable rows and of the error corrected rows;
    counting the number of error corrected symbols in each column;
    storing the states of the corrected symbols;
    setting erasure flags for each column, based on the count results and the stored data; and
    correcting errors in each column.

7. An error correcting method according to claim 6, wherein the step of setting the erasure flags includes the steps of:
    setting the erasure flags for the corresponding symbols when the first total number of uncorrectable rows+(d1−1)/2-error corrected rows+ . . . +(N+1)-error corrected rows+N-error corrected rows (d1: the minimum distance between code words in the row correction, N: an integer equal to or below (d1−1)/2) is equal to or below d2−1 (d2: the minimum distance between code words in the column correction);
    setting the erasure flags for the corresponding symbols when the total number exceeds d2−1 in the previous step and the total number of uncorrectable rows+(d1−1)/2-error corrected rows+ . . . +N+1-error corrected rows+N-error corrected symbols is equal to or below d2−1;
    decrementing N by one when the total number exceeds d2−1 in the previous step;
    repeating the first to third steps; and
    setting the erasure flags for the uncorrectable rows when the total number of uncorrectable rows and (d1−1)/2-error correction symbols exceeds d2−1.

8. An error correcting method according to claim 6, wherein the erasure flags are changed for each column in the column correction.

9. An error correcting method according to claim 6, wherein the respective numbers of the uncorrectable rows and of the (d1−1)/2-error corrected rows are counted, and the numbers of (d1−1)/2-error corrected symbols (d1: the minimum distance between code words in the row correction) are counted.

10. An error correcting method according to claim 9, wherein the step of setting the erasure flags includes the steps of:
    setting the erasure flags for the corresponding symbols when the total number of uncorrectable rows and (d1−1)/2-error corrected rows is equal to or below d2−1 (d2: the minimum distance between code words in the column correction),
    setting the erasure flags for the corresponding symbols when in the previous step the total number exceeds d2−1 and the total number of uncorrectable rows and the (d1−1)/2-error corrected symbols is equal to or below d2−1, and
    setting the erasure flags for the uncorrectable rows when in the previous step the total number exceeds d2−1.

11. A computer readable medium containing program instructions for correcting an error in a digital signal using an erasure flag process, the program instructions including instructions for performing the steps comprising:
    correcting errors in each row;
    counting the respective numbers of the uncorrectable rows and of the error corrected rows;
    counting the number of error corrected symbols in each column;
    storing the states of the corrected symbols;
    setting erasure flags for each column, based on the count results and the stored data; and
    correcting errors in each column.

12. A computer readable medium according to claim 11, wherein said program instructions include instructions for:
    setting the erasure flags for the corresponding symbols when the first total number of uncorrectable rows+ (d1−1)/2-error corrected rows+ . . . +(N+1)-error corrected rows+N-error corrected rows (d1: the minimum distance between code words in the row correction, N: an integer equal to or below (d1−1)/2) is equal to or below d2−1 (d2: the minimum distance between code words in the column correction);
    setting the erasure flags for the corresponding symbols when the total number exceeds d2−1 in the previous step and the total number of uncorrectable rows+ (d1−1)/2-error corrected rows+ . . . +N+1-error corrected rows+N-error corrected symbols is equal to or below d2−1;
    decrementing N by one when the total number exceeds d2−1 in the previous step;
    repeating the first to third steps; and
    setting the erasure flags for the uncorrectable rows when the total number of uncorrectable rows and (d1−1)/2-error correction symbols exceeds d2−1.

13. A computer readable medium according to claim 11, wherein the erasure flags are changed for each column in the column correction.

14. A computer readable medium according to claim 11, wherein said program instructions include instructions for:
    counting the respective numbers of the uncorrectable rows and of the (d1−1)/2-error corrected rows; and
    counting the number of (d1−1)/2-error corrected symbols (d1: the minimum distance between code words in the row correction).

15. A computer readable medium according to claim 14, wherein said program instructions include instructions for:
    setting the erasure flags for the corresponding symbols when the total number of uncorrectable rows and (d1−1)/2-error corrected rows is equal to or below d2−1 (d2: the minimum distance between code words in the column correction),
    setting the erasure flags for the corresponding symbols when in the previous step the total number exceeds d2−1 and the total number of uncorrectable rows and the (d1−1)/2-error corrected symbols is equal to or below d2−1, and
    setting the erasure flags for the uncorrectable rows when in the previous step the total number exceeds d2−1.

* * * * *